United States Patent
Jacobsen et al.

(10) Patent No.: US 6,274,508 B1
(45) Date of Patent: Aug. 14, 2001

(54) APPARATUSES AND METHODS USED IN FORMING ASSEMBLIES

(75) Inventors: Jeffrey Jay Jacobsen, Hollister, CA (US); Glenn Wilhelm Gengel, Berthoud, CO (US); John Stephen Smith, Berkeley, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 09/270,147

(22) Filed: Mar. 16, 1999

Related U.S. Application Data

(60) Provisional application No. 60/118,887, filed on Feb. 5, 1999.

(51) Int. Cl.[7] .................... H01L 21/31; H01L 21/469
(52) U.S. Cl. .................... 438/758; 438/637; 156/324
(58) Field of Search .................... 438/758, 622, 438/678, 637, 667; 156/324, 351, 362, 359, 513, 552; 264/287

(56) References Cited

U.S. PATENT DOCUMENTS

| | | | |
|---|---|---|---|
| 4,003,660 | * 1/1977 | Christie, Jr. et al. | 356/178 |
| 4,289,725 | * 9/1981 | Müller et al. | 264/287 |
| 5,192,388 | * 3/1993 | Schollkopf et al. | 156/324 |
| 5,788,802 | * 8/1998 | Raney | 156/351 |

* cited by examiner

*Primary Examiner*—David Nelms
*Assistant Examiner*—Phuc T. Dang
(74) *Attorney, Agent, or Firm*—Blakely, Sokoloff, Taylor & Zafman

(57) ABSTRACT

Apparatuses and methods for forming holes or recessed regions in a substrate or a web material used in displays is disclosed. One embodiment of the invention relates to a roller or template that creates recessed regions or holes by pressing protruding structures from a template or roller in the substrate while the substrate is moving through a web process. These recessed regions or holes in the substrate receive, in one embodiment, elements that have integrated circuits thereon. Another embodiment shows recessed regions or holes being created in a web material by a template or a roller while the web material is moving through a web process. Another embodiment of the invention includes using a web wheel to create recessed regions or holes in the substrate. Another embodiment includes using chemical etching to create recessed regions or holes in the web material.

9 Claims, 17 Drawing Sheets

APPARATUSES AND METHODS USED IN FORMING ASSEMBLIES

This application claims the benefit of the earlier filing date of co-pending provisional application of Jeffrey Jay Jacobsen entitled, "Apparatuses and Methods for Forming Assemblies," Ser. No. 60/118,887, filed Feb. 5, 1999 and incorporated herein by reference.

BACKGROUND INFORMATION

1. Field of the Invention

The present invention relates generally to the field of fabricating assemblies which include functional blocks that are deposited into a substrate. More particularly, the present invention relates to apparatuses and methods for forming holes or recessed regions in a flexible substrate in a web process.

2. Description of Related Art

Various different types of assemblies include functional blocks that are deposited into receiving regions of a substrate. One such type of assembly is a display panel. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors at least in some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly (FSA); an example of this process is described in U.S. Pat. No. 5,545,291. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly. Using this technique, various blocks, each containing a functional component, may be fabricated on one substrate and then separated from that substrate and assembled onto a separate rigid substrate through the fluidic self assembly (FSA) process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 which was filed Feb. 16, 1999 by the inventor John Stephen Smith and which is entitled "Functionally Symmetric Integrated Circuit Die". This application is hereby incorporated herein by reference.

As noted above, FIGS. 1B and 1D illustrate a display substrate 12 with blocks 14 formed in the rigid substrate 12. These blocks 14 may be deposited through an FSA process.

In the FSA process, a slurry containing the blocks 14 is deposited over the rigid substrate 12 and the blocks 14 rest in corresponding openings in the substrate 12.

FIG. 2 shows a block 14 and a circuit element (not shown) on the top surface 18 of block 14. Generally, blocks have a trapezoidal cross-section where the top of the block is wider than the bottom of the block.

FIG. 3 shows block 14 in a recessed region of the rigid substrate 12. Between the block and the rigid substrate is an eutetic layer 13. The block has a top surface 18.

FIG. 4 shows a planar side view of a rigid substrate coupled to a rigid display backplane with a plurality of blocks between the display backplane 30 and substrate 12. The plurality of blocks are functionally part of the display backplane 30 and are deposited onto receptor regions of the substrate 12. Each block drives at least one transparent pixel electrode. The pixel electrode is fabricated over a transistor which is fabricated in the block.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration. FIG. 6 shows pixel electrodes 42 on top of a substrate.

There are several disadvantages inherent to the related art. Rigid flat-panel displays are limited in that they are generally coupled to rigid objects. Flexible objects may cause too much stress on rigid flat-panel displays that could affect the electrical interconnections in rigid flat-panel displays.

Another disadvantage to these flat-panel displays is that they are manufactured in a batch operation. Batch operations inherently involve a certain amount of down time in production. This increases production time to fabricate display panels. Additionally, flat-panel displays are generally fabricated on rigid substrates that are not continuous in length. This also decreases productivity since the assembly of the flat-panel displays is interrupted until another substrate panel is available to assemble the flat-panel display.

There are several disadvantages inherent to the related art. Presently, hazardous substances such as hydrofluoric acid and other like acids must be used in the traditional methods to form recessed regions in a substrate. Hydrofluoric acid poses a hazard to human health and the environment and increases disposal costs for companies because it must be treated as a hazardous waste. Accordingly, it would be useful to have a method or apparatus that formed holes or recessed regions in a substrate while minimizing the use of these materials.

SUMMARY

The present invention provides various apparatuses and methods for creating recessed regions or holes in a substrate of a web material in an in-line web process, where the hole or regions are for receiving functional blocks, each containing at least one functional element. The substrate in which holes or recessed regions are created may be either rigid or flexible.

Recessed regions or holes in the substrate are created on a web by a roller, template, or a web wheel which have protruding structures. Recessed regions or holes also may be created in the web material by chemical etching.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements. Note also that the drawings are not to scale.

DETAILED DESCRIPTION

The present invention relates to apparatuses and methods for forming holes or recessed regions in a substrate or web material used to form a display. The following description and drawings are illustrative of the invention and are not to be construed as limiting the invention.

One embodiment in accordance with the invention includes a substrate in which a roller that is moved across a substrate or the substrate passes under the roller and contacts the protruding structures from the roller. The roller creates holes or recessed regions in the substrate. A template in which structures protrude from the template itself may be used to create recessed regions instead of a roller. A template is then pressed against the substrate to create recessed regions or holes in the substrate. Another embodiment of the invention relates to creating recessed regions or holes in a web material using either a roller or template.

Embodiments of the invention apply to both flexible and rigid substrates. By creating recessed regions in a substrate, the substrate is able to receive an object that may have a circuit element thereon. The blocks are contained in a slurry which is deposited onto the flexible substrate. Although blocks may be comprised of single crystal silicon or other like material which makes the block rigid, the substrate may still be flexible because the size of these blocks (50×100 microns or 100×100 microns) is small in comparison to the flexible substrate. The flexible substrate forms part of a display backplane. The flexible displays may be either an active matrix or a passive matrix displays.

In the following description, numerous specific details such as specific materials, processing parameters, processing steps, etc., are set forth in order to provide a thorough understanding of the invention. One skilled in the art will recognize that these details need not be specifically adhered to in order to practice the claimed invention. In other instances, known processing steps, materials, etc., are not set forth in order not to obscure the invention.

Figure 1A:
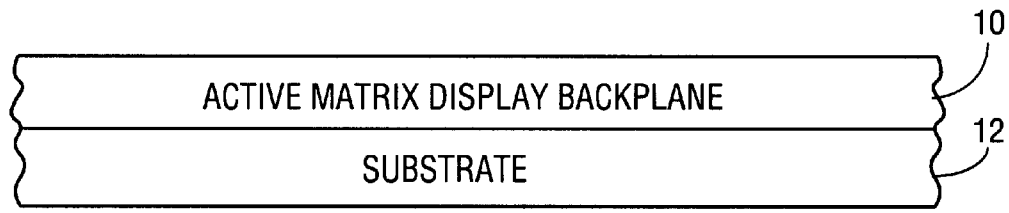
FIG. 1A shows a planar side view of an active matrix display backplane coupled to a rigid substrate.
Figure 1B:
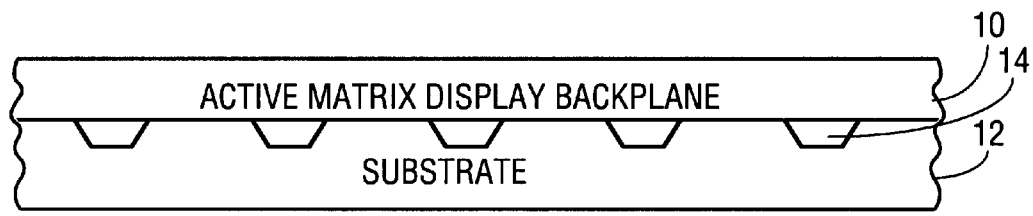
FIG. 1B shows a planar side view of an active matrix display backplane coupled to a rigid substrate wherein a plurality of blocks are part of the active matrix display.
Figure 1C:
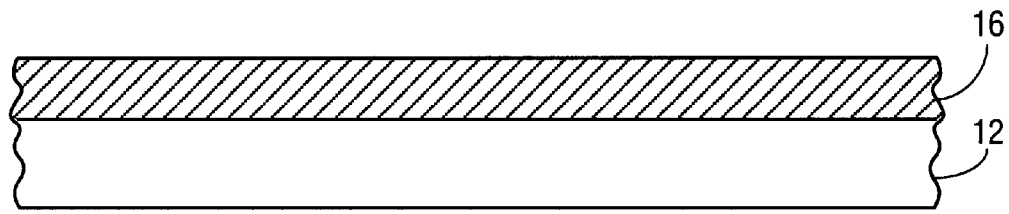
FIG. 1C shows a planar side view of a reflective display backplane coupled to a rigid substrate.
Figure 1D:
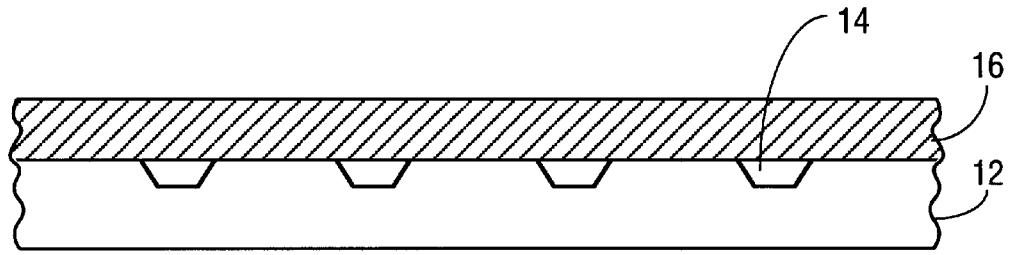
FIG. 1D shows a planar side view of a reflective display backplane coupled to a rigid substrate wherein a plurality of blocks are coupled to the reflective display and to the rigid substrate.
Figure 2:
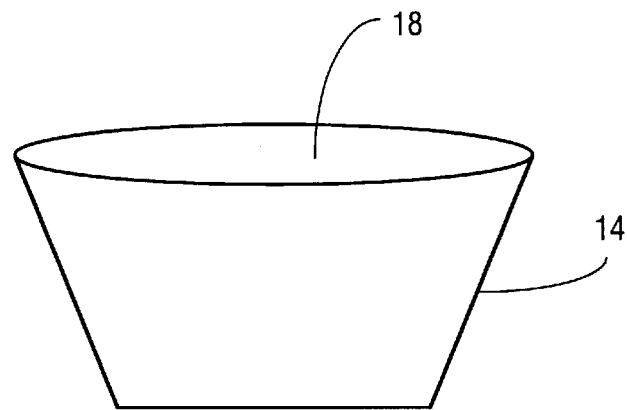
FIG. 2 shows a top perspective view of a circuit element block.
Figure 3:
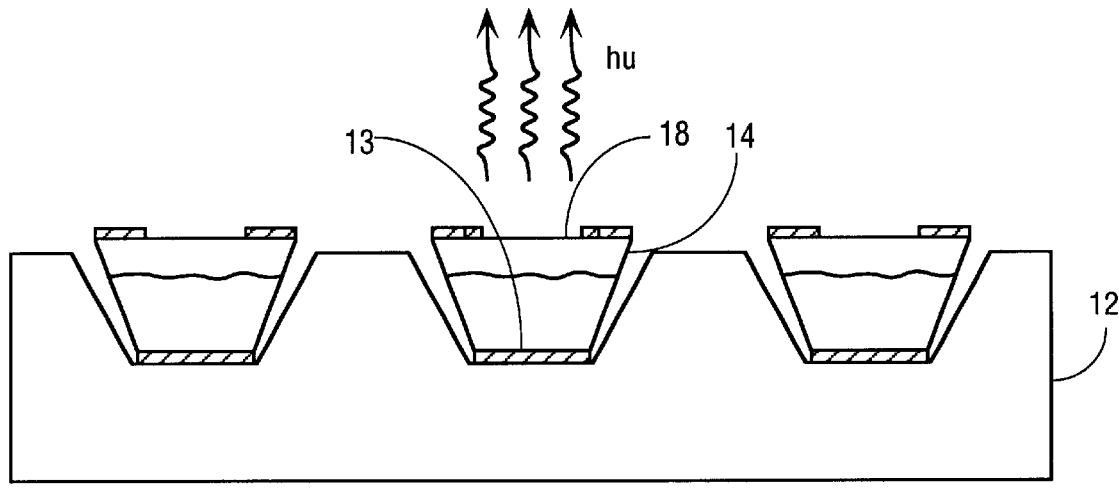
FIG. 3 shows a planar side view of blocks in recessed regions of the rigid substrate and a metalization surface on the blocks.
Figure 4:
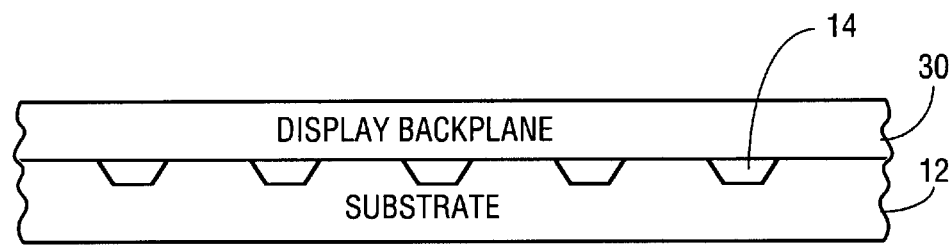
FIG. 4 shows a planar side view of a rigid substrate coupled to a rigid display backplane with a plurality of blocks between the display backplane and substrate.
Figure 5:
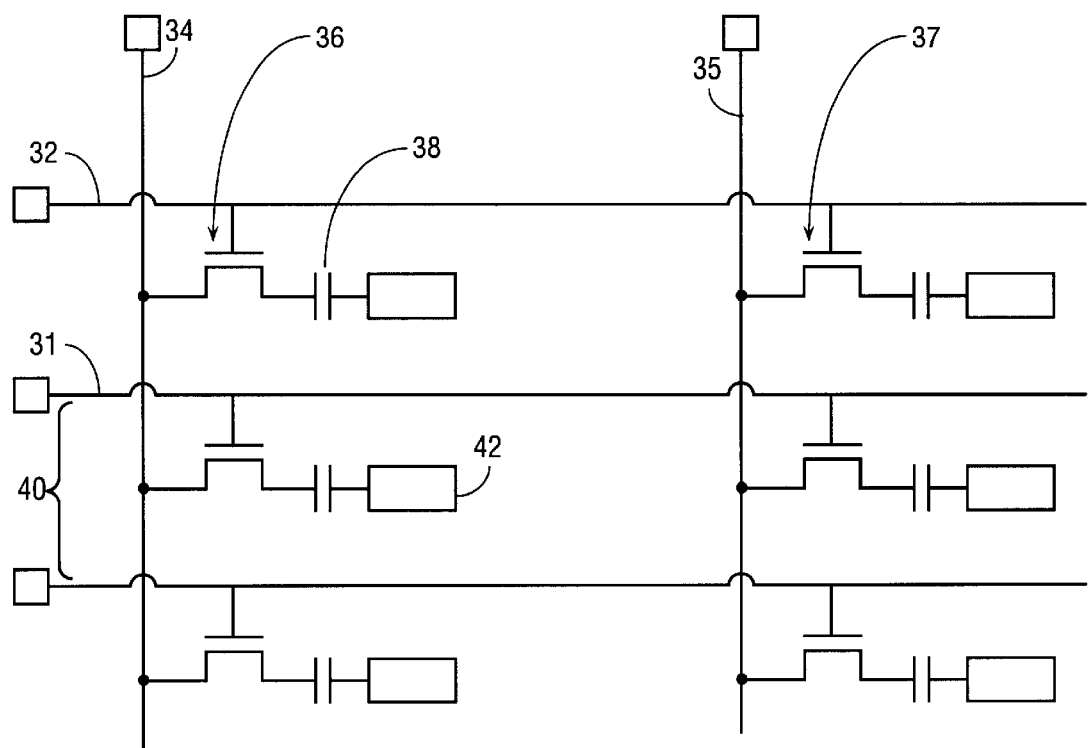
FIG. 5 schematically represents a portion of an array of an active matrix backplane.
Figure 6:
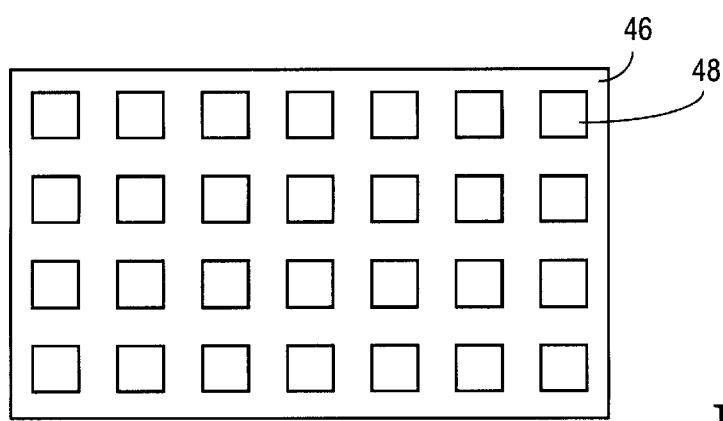
FIG. 6 shows a top view of a plurality of pixel electrodes in a backplane.
Figure 7A:
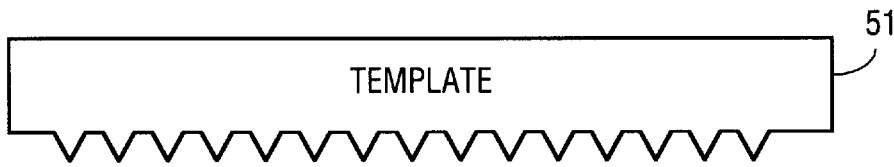
FIGS. 7A–7I shows a substrate wherein a roller or template is used to create recessed regions or holes into a substrate.
Figure 7B:
Figure 7C:
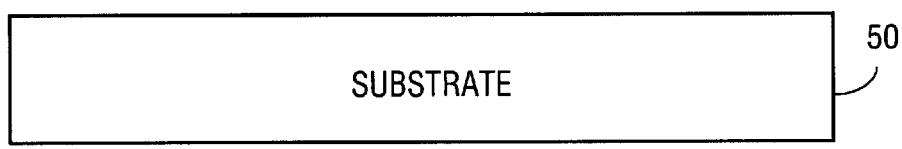
Figure 7D:
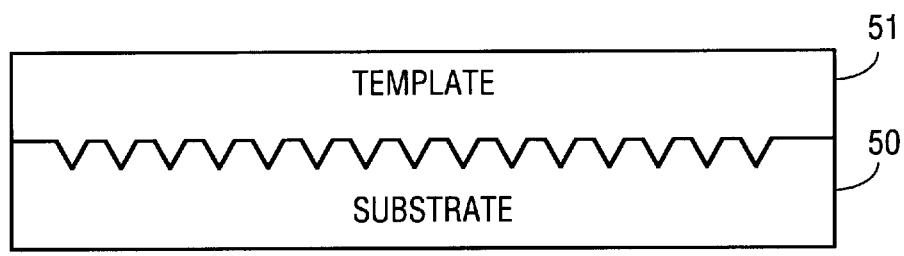

FIGS. 7A–7I shows a substrate 50 that may be either flexible or rigid. Flexible substrates may be comprised of plastic, glass, or silicon. Rigid substrates may be comprised of material such as glass. FIG. 7A shows a template 51 with protruding structures. Protruding structures may range in shapes and sizes depending upon the object that is to be placed into a substrate or web material. The length of the protruding structure may range from 500Å to 70 microns or larger in some cases. Similarly, the diameter or other dimension (e.g., width) of a protruding structure may range from 100Å to 70 microns or larger in some cases. The width of the protruding structure is typically 4:1 relative to the length of the protruding structure but different ratio dimensions may be used. If the protruding structure is rectangular in shape, then both sides of the object may range from 500Å to 70 microns. The template is comprised of sturdy materials (e.g., steel, polymers, etc.). FIG. 7B shows a template 51 with protruding structures facing one side of a substrate 50. FIG. 7C shows the template 51 contacting the substrate 50 and the protruding structures from the template 51 pierce the substrate 50. These protruding structures may be a variety of shapes depending on the shapes of objects to be deposited onto the substrate 50. FIG. 7D shows that when the template 51 is separated from the substrate 50, recessed regions or holes are created in the substrate 50.

Figure 7E:
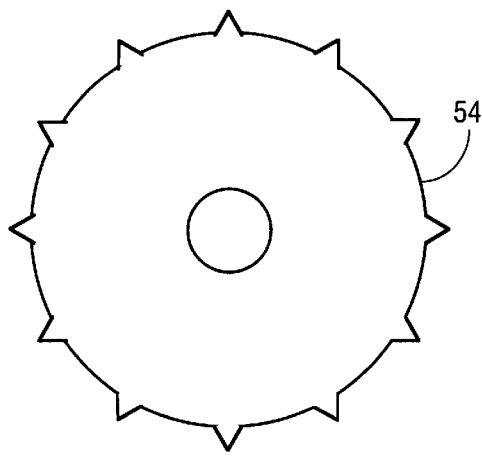
Figure 7F:
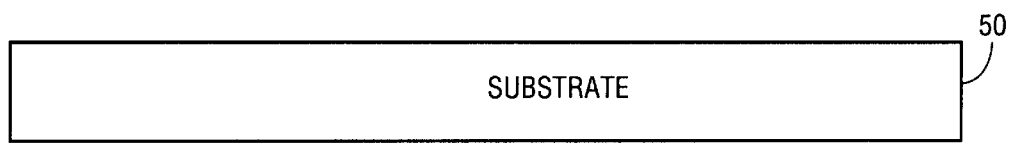
Figure 7G:
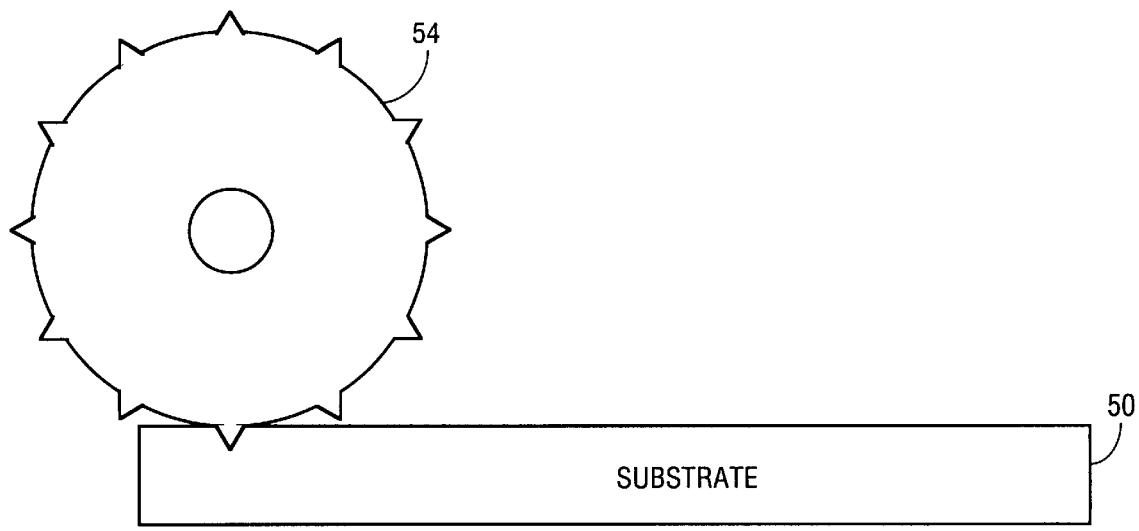
Figure 7H:
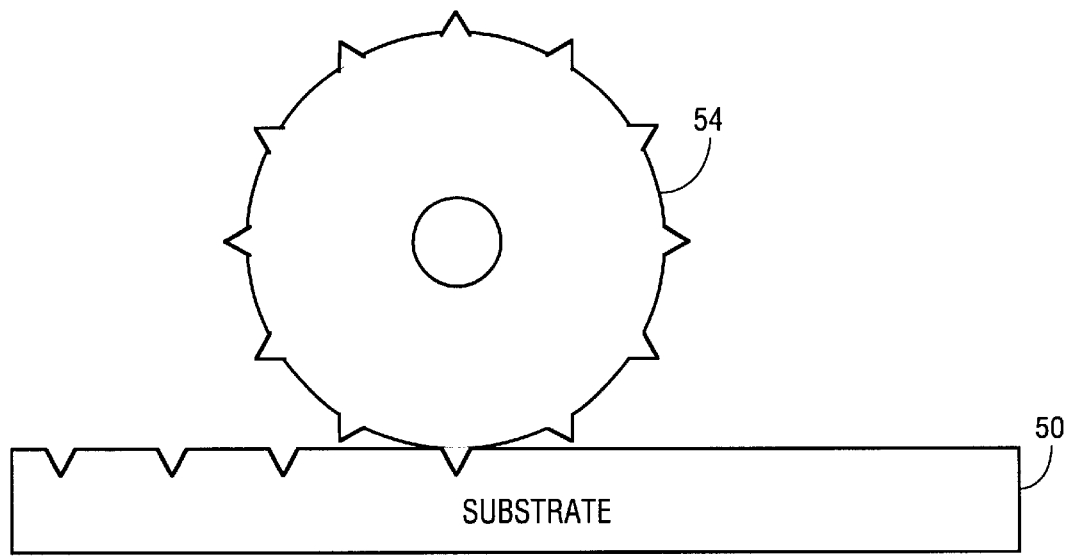
Figure 7I:
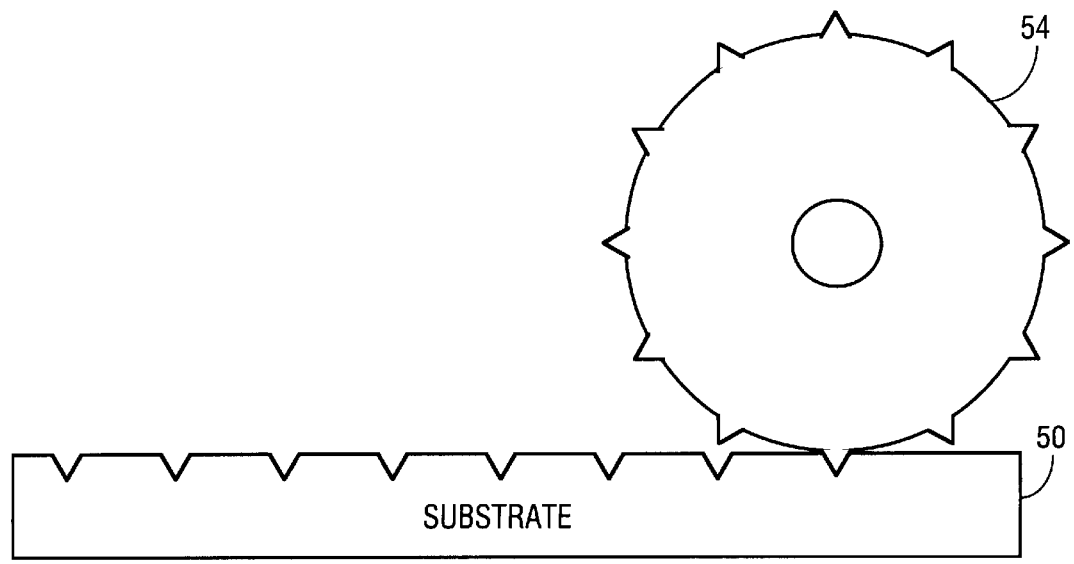

Instead of using a template to create recessed regions or holes, FIGS. 7E–7I show a roller 54 with protruding structures being used on a substrate 50. A roller 54 may be comprised of sturdy materials (e.g., steel, polymers, aluminum, electroformed nickel, rubber, etc.) FIG. 7E shows a roller 54 with protruding structures. FIG. 7F shows a substrate 50 without recessed regions or holes. FIG. 7G shows the roller 54 contacting the substrate. FIGS. 7H–7I shows the roller 54 moving across the substrate 50. Recessed regions or holes are created in the substrate 50 after the protruding structures on the roller 54 pierce the substrate and then are removed from the substrate as the roller 54 moves across the substrate. It should be noted that a roller includes a web wheel.

Instead of showing how recessed regions are created in a substrate, FIGS. 8A–8I show recessed regions or holes created in web material 59 by a template 51 or roller 54. Web material 59 may be comprised of polyether sulfone (PES), polyethylene terephthalate, polycarbonate, polybutylene terephthalate, polyphenylene sulfide (PPS), polypropylene, polyester, aramid, polyamide-imide (PAI), polyimide, nylon material (e.g. polyamide), aromatic polyimides, polyetherimide, polyvinyl chloride, acrylonitrile butadiene styrene (ABS), or metallic materials. Web is a flexible sheet with very high aspect ratios such as 25:1 or more (length:width). Web involves a roll process. For example, a roll of paper towels when unrolled is said to be in web form and it is fabricated in a process referred to as a web process. When a web is coiled, it is in roll form.

Figure 8A:
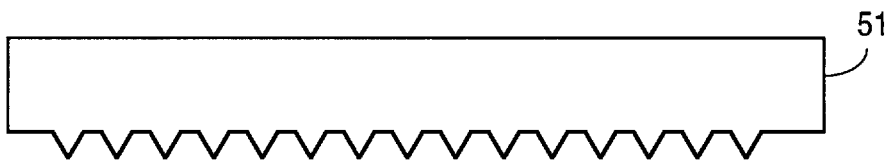
FIGS. 8A–8D shows recessed regions or holes being created in web material by a template and FIGS. 8E–8I shows recessed regions created in web material by a roller.
Figure 8B:
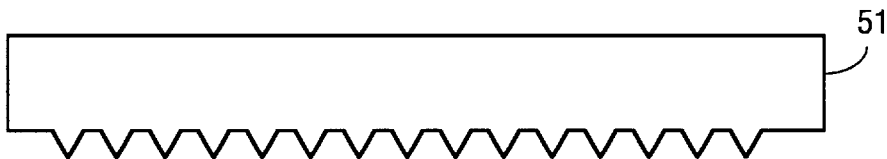
Figure 8C:
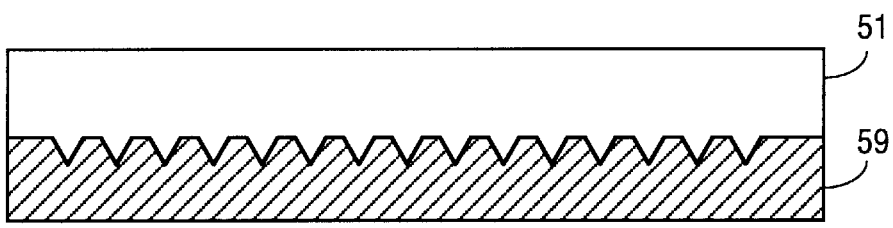
Figure 8D:
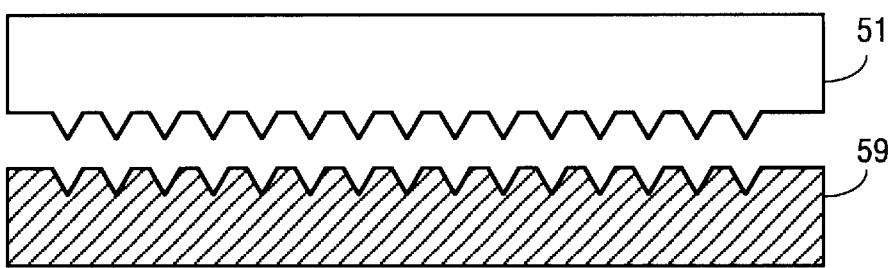

FIG. 8A shows a template 51 with protruding structures. FIG. 8B shows a template 51 with protruding structures facing one side of the web material 59. FIG. 8C shows the template 51 contacting the web material 59 and the protruding structures from the template 51 pierce the web material 59. FIG. 8D shows that when the template 51 is separated from the web material 59, recessed regions or holes are created in the web material 59.

Figure 8E:
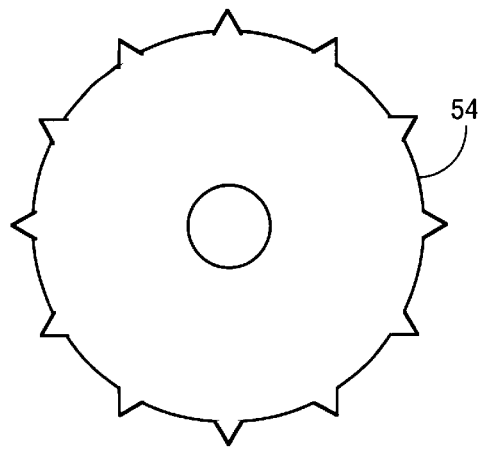
Figure 8F:
Figure 8G:
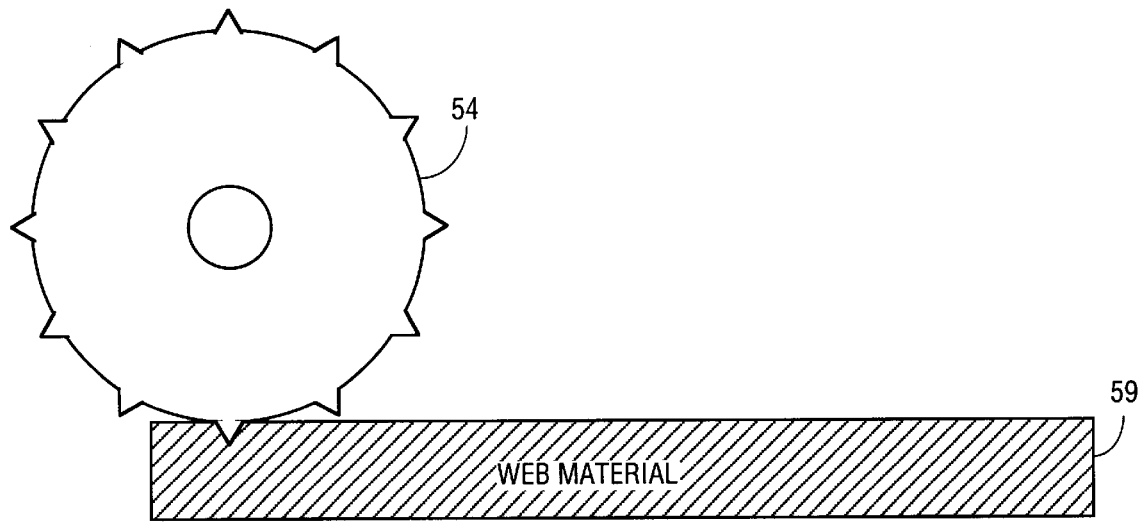
Figure 8H:
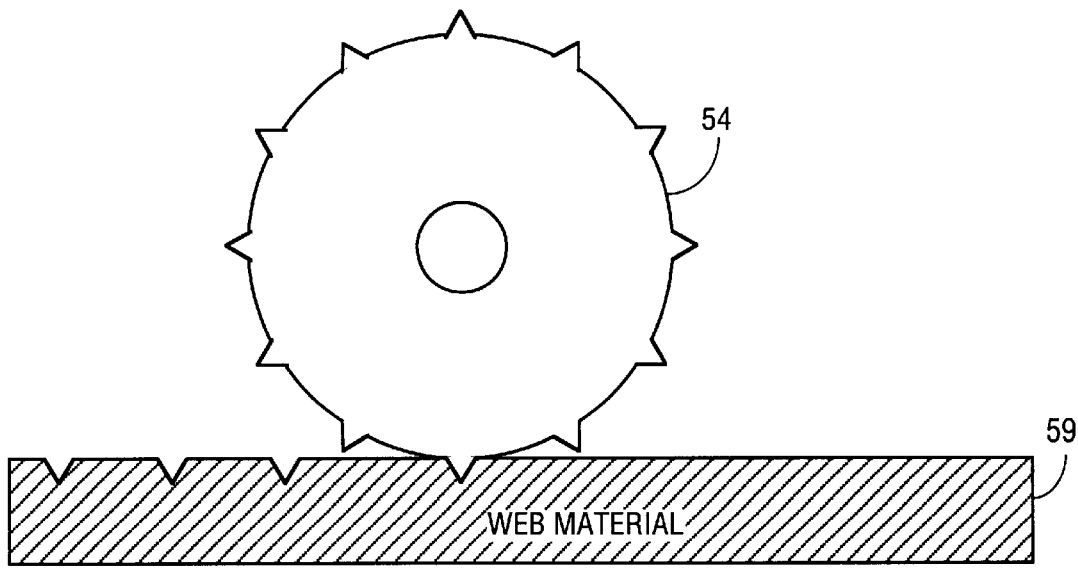
Figure 8I:
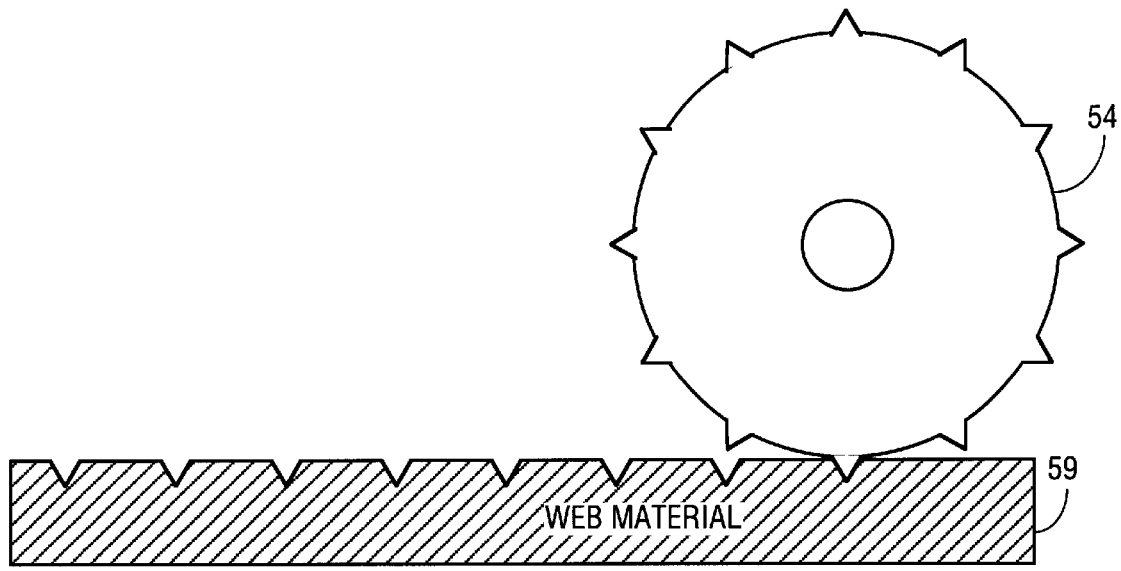

Instead of using a template to create recessed regions or hole, FIGS. 8E–8I show a roller 54 with protruding structures. FIG. 8E shows a roller 54 with protruding structures. FIG. 8F shows a web material 59. FIG. 8G shows a web material 59 in which a roller 54 has contacted the roller for the purpose of creating holes or recessed regions in the web material 59. FIG. 8H shows the roller 54 contacting the web material 59 and actually creating recessed regions in the web material 59. FIG. 8I shows the roller 54 moving across the web material 59. Recessed regions or holes are created in the web material 59.

Figure 9A:
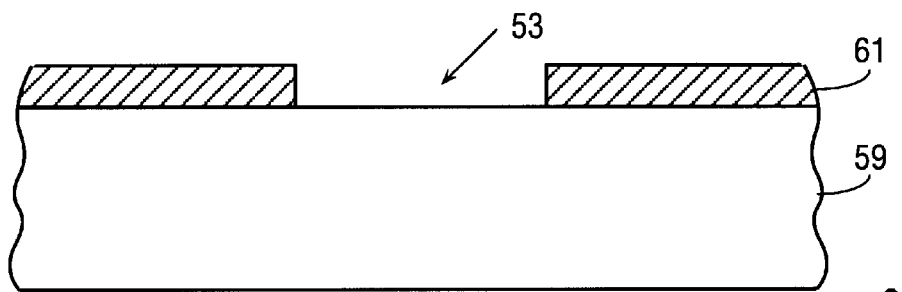
FIGS. 9A–9B show chemical etching of web material.
Figure 9B:
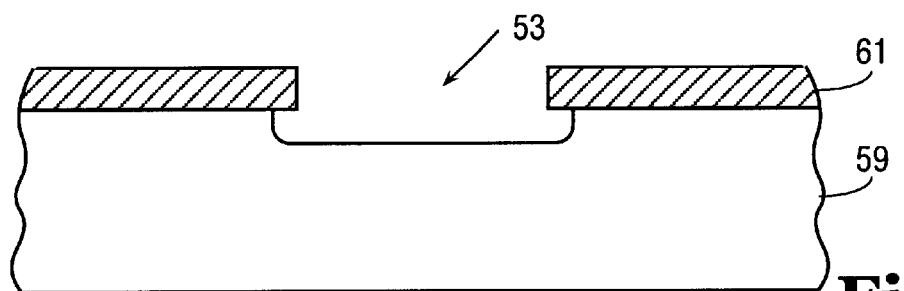

FIGS. 9A–9B show cross-sectional views of chemical etching of web material. This process typically involves: coating for photo resist, exposing the web material, developing the photo resist, etching the target material and stripping the remaining photo resist.

For the purpose of illustration, the web material is polyamide. However, the web material in this embodiment may be comprised of a variety of materials as described herein. Each of the figures shows the state of the opening after certain other process operations in this method. FIG. 9A shows a patterned mask layer which includes an opening exposing a top surface of a web material 59. FIG. 9B shows a patterned mask layer 61 which includes an opening exposing a top surface of a web material. The patterned mask layer 61 may be, for example, a photopolymer. The exposed areas of the web material 59 are etched using an appropriate etchant. In one example, this etch is a wet etch bath using an effective etchant (e.g. alcohol, potassium hydroxide, hydrazine, or sodium hydroxide) which creates the opening 53 in the web material 59 as shown in FIG. 9B. The mask 61 may then be removed and the hole is prepared to receive a functional block.

It will be appreciated for the process shown in FIGS. 9A–9B, the etchant used to etch the web material will depend upon the material of the web material, and the masking layers will be designed to be resistant to those etchants. Additionally, although multiple etches are described, a single etch may be used to create a plurality of recessed regions in the web material.

Figure 10A:
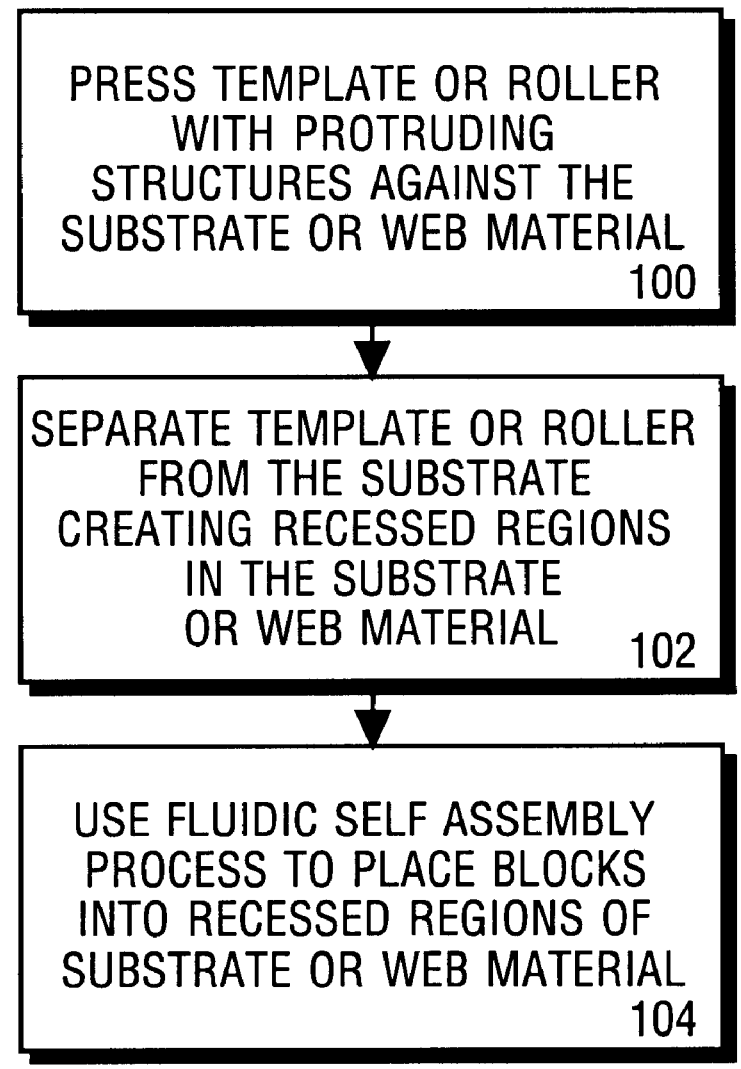
FIG. 10A shows a method of creating a display wherein recessed regions or holes are created in a substrate or web material.

FIG. 10A shows a method of assembling a flexible display along the length of a flexible substrate 50 in accordance with an embodiment of the invention. A roller 54 or template 51 is used to create recessed regions or holes in a substrate or a web material at operation 100. Small structures may protrude from the roller 54 or template 51. These structures may be of similar or different sizes. Additionally, these structures may be evenly or randomly spaced from one another.

The roller may be rolled onto the substrate either mechanically or by a person rolling it over the substrate. The structures on the roller 54 pierce the substrate or a web material creating recessed regions or holes in the substrate at operation 102. Similarly, a template 51 may have protruding structures that are used to create recessed regions or holes in the substrate. The template may be pressed or otherwise applied to the substrate. The protruding structures create the recessed regions or holes in the substrate or a web material. Fluidic self assembly (FSA) process as described in U.S. Pat. No. 5,545,291 may be used to place blocks onto the substrate or web material at operation 104.

Figure 10B:
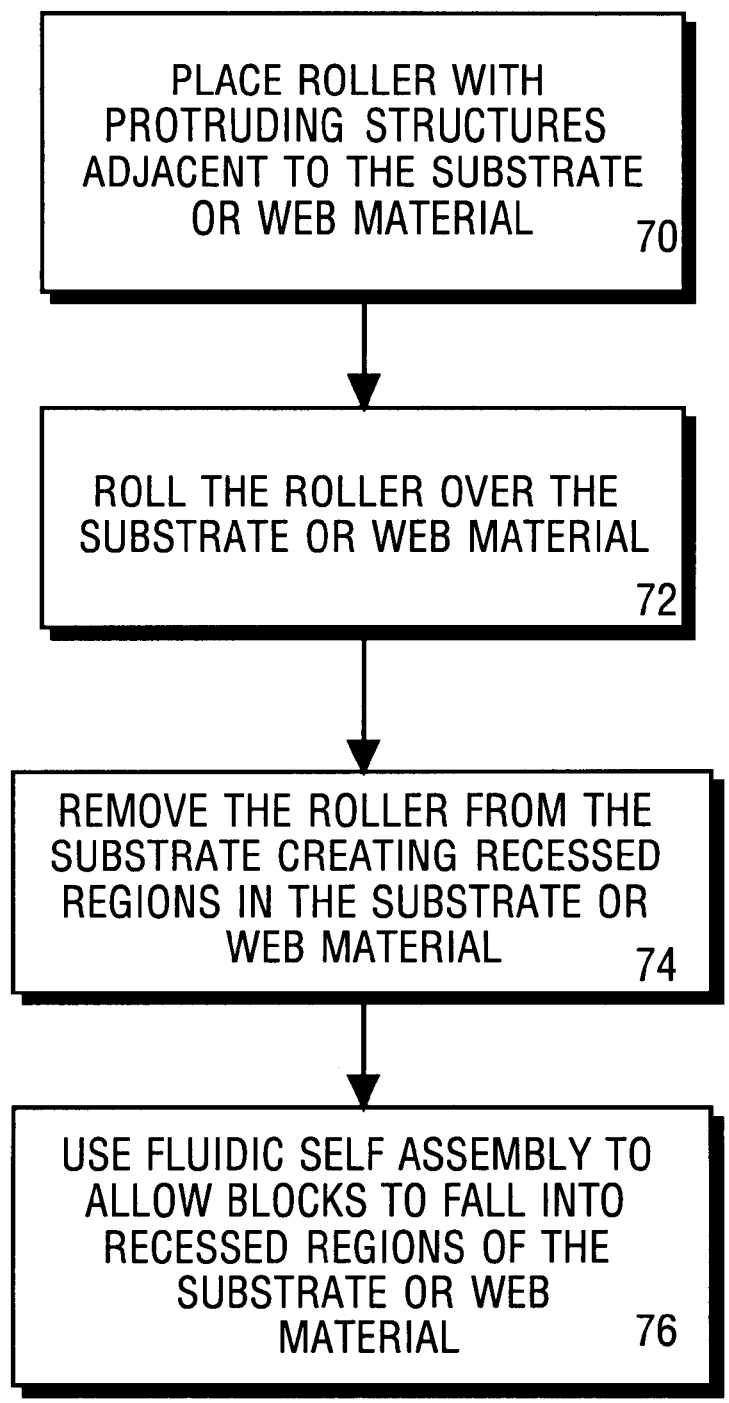
FIG. 10B shows a method of assembling a flexible display along a continuous sheet of web material.

FIG. 10B shows a method of assembling a flexible display along a continuous sheet of a flexible web material 59 in accordance with an embodiment of the invention. First, a roller 54 or template 51 is used to create recessed regions or holes in a web material 59. Small structures may protrude from the roller 54. These structures may be of similar or different sizes. Additionally, these structures may be evenly or randomly spaced from one another.

The roller 54 may be rolled onto the web material 59 either mechanically or by a person rolling it over the web material 59. The structures on the roller pierce the web material 59 creating recessed regions or holes in the web material 59. Similarly, a template may have protruding structures that are used to create recessed regions or holes in the web material 59. The template may be pressed or otherwise applied to the web material 59. The protruding structures of the template create the recessed regions or holes in the web material 59.

Utilizing an FSA process, a plurality of blocks are deposited in a slurry that go into the recessed regions of the flexible substrate. Planarization of the assembly of blocks into substrate 72 is the next operation. The roller is removed from the substrate at operation 74 thereby creating recessed regions in the substrate or web material. At operation 76, fluidic self assembly is used to place the blocks into recessed regions of the substrate or web material. The display is then made to conform the object's shape.

Figure 11:
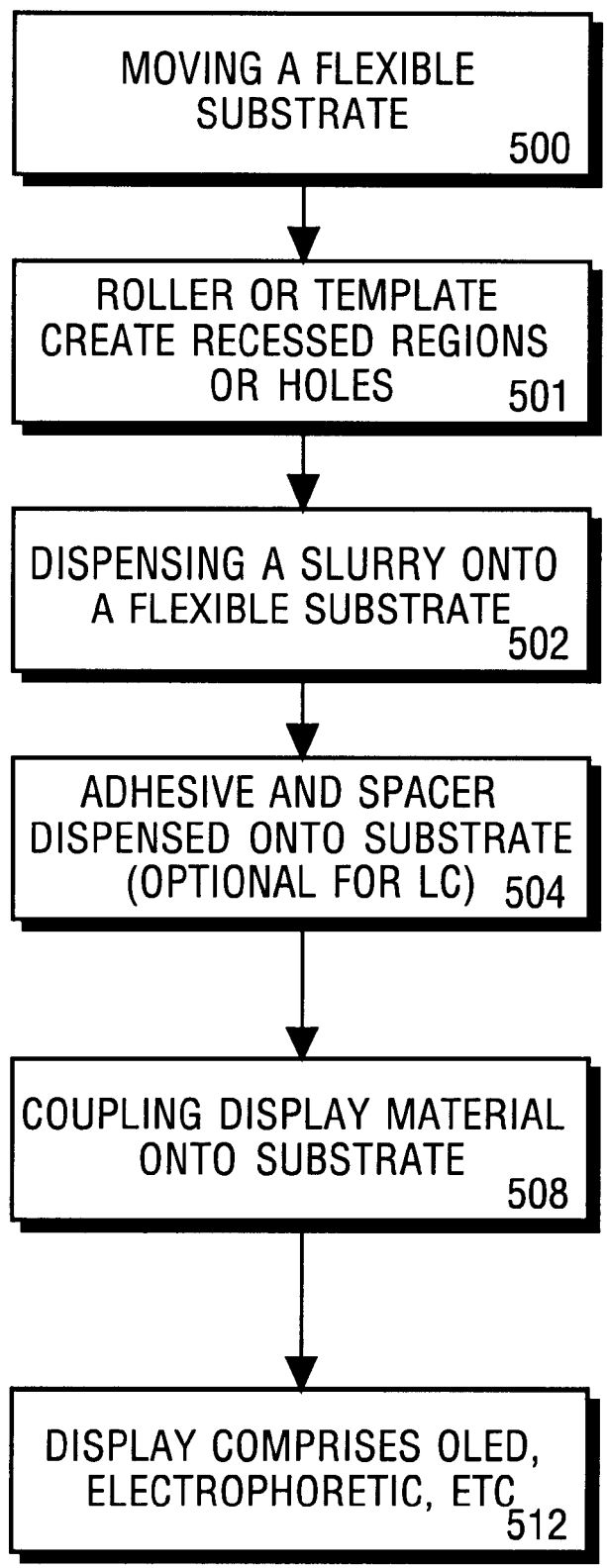
FIG. 11 shows a method in which recessed regions or holes are created in a substrate or a web material.

FIG. 11 shows a method of fabricating a display device wherein a flexible substrate and a display tape undergo processing and are subsequently coupled. The flexible substrate is advanced along a process line at operation 500. A roller 54 or template 51 is used to create holes or recessed regions in the substrate at operation 501. A slurry containing a plurality of blocks is dispensed onto the flexible substrate at operation 502. A second slurry containing a plurality of blocks may also be dispensed onto the substrate. Excess slurry is collected in a container and is recycled. The blocks fall into recessed regions in the substrate. Adhesives and spacers are deposited onto the substrate at operation 504. Display material is placed onto the substrate at operation 508. This material may comprise polymer-dispersed liquid crystal, cholesteric liquid crystal, electrophoretic liquid crystal, upconverting phosphor, downconverting phosphor, or OLED at operation 512.

Figure 12:
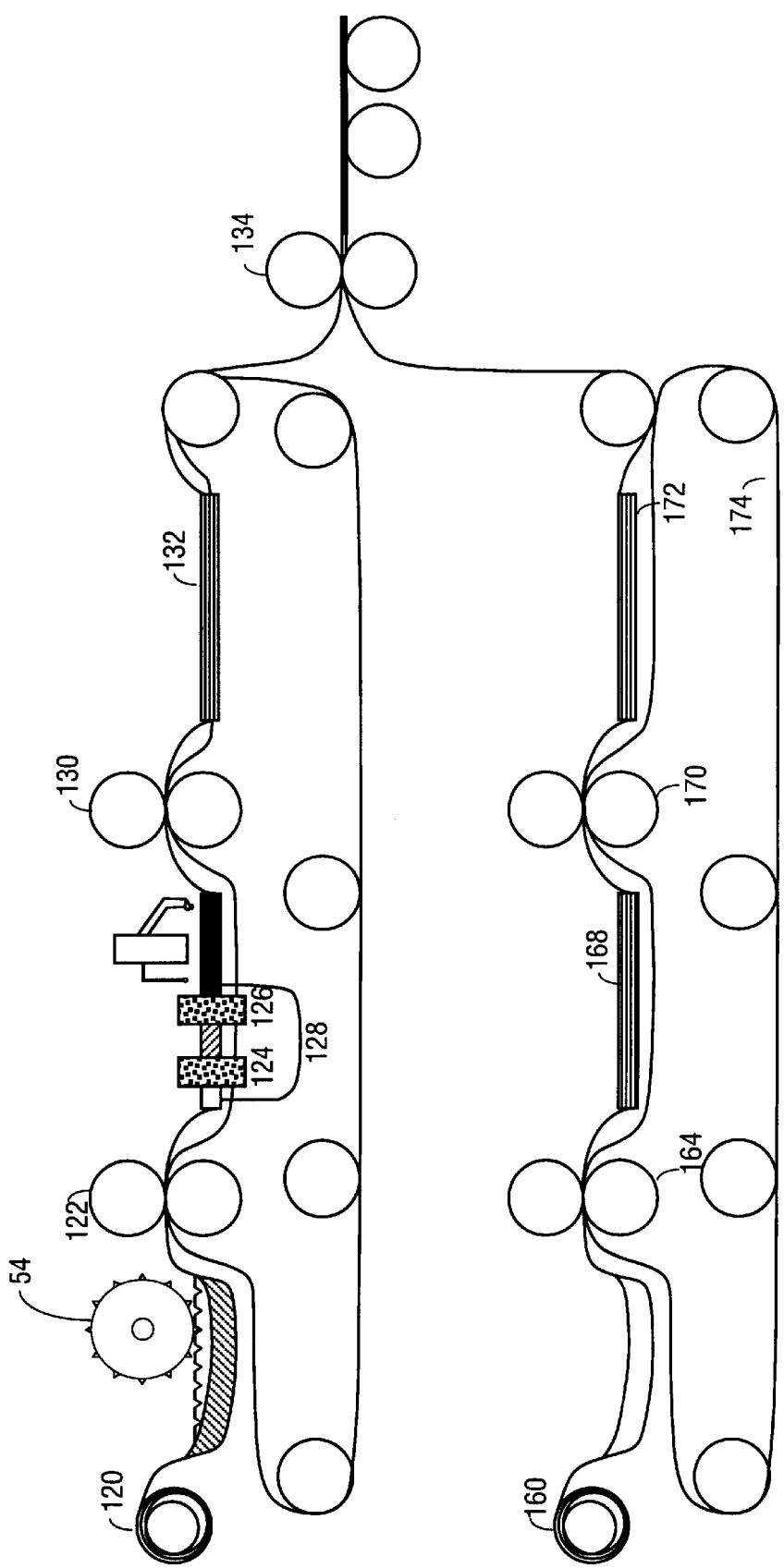
FIG. 12 shows displays created on an in-process line wherein recessed regions or holes are created on a substrate. Alternatively, recessed regions or holes are created in a web material.

FIG. 12 shows the overall process of fabricating a display device wherein a flexible substrate such as web material 120 and a display tape 160 undergo processing and are subsequently coupled. There, the flexible substrate is advanced along a first process line and advances through a first set of support members 122. A roller 54 or a template is used to create holes or recessed regions in the substrate. Alternatively, a roller 54 or a template is used to create holes or recessed regions in a web material 120. A first slurry 124 containing a plurality of blocks is dispensed onto the flexible substrate. A second slurry 126 containing a plurality of blocks is again dispensed onto the substrate. Excess slurry is collected in a container 128 and is recycled. The blocks fall into recessed regions in the substrate. Flexible substrate 120 is advanced through a second set of support members 130. An interconnect 132 is then deposited onto flexible substrate 120. The flexible substrate is then advanced to point 134. In conjunction with this process, display tape 160 undergoes a separate process. Display material is placed onto at least one side of the display tape 160. Display tape 160 is advanced through a first set of support members 164. The display material is patterned or layered 168. This display material may comprise polymer-dispersed liquid crystal, cholesteric liquid crystal, electrophoretic liquid crystal, OLED, upconverting phosphor, or downconverting phosphor. Display tape 160 is advanced through a second set of support members 170. An interconnect 172 is either deposited or etched onto the display tape 160. The interconnect between the rows and columns is comprised of flexible and conductive material. For example, the interconnect could be made of conductive polymers, metals (e.g., aluminum, copper, silver, gold, etc.), metal particles, conductive organic compounds, or conductive oxides. The display tape is then advanced to point 134 where the display tape is coupled to the substrate. A conveyor belt 174 surrounds the support members.

In order to soften rigid substrates, heat may be applied to the rigid substrates to make it easier to create recessed regions or holes therein. A variety of heat transfer methods may be used to soften the rigid substrate. For example, heat may be transferred to a rigid substrate by placing the rigid substrate adjacent to conductive material or to containerized fluid wherein a heat source is applied to the conductive material. A heat source also may be applied directly to the rigid substrate.

In addition to a template or roller creating holes or recessed regions in a substrate or web material, these devices may also be used to create holes or recessed regions in tape.

Figure 13:
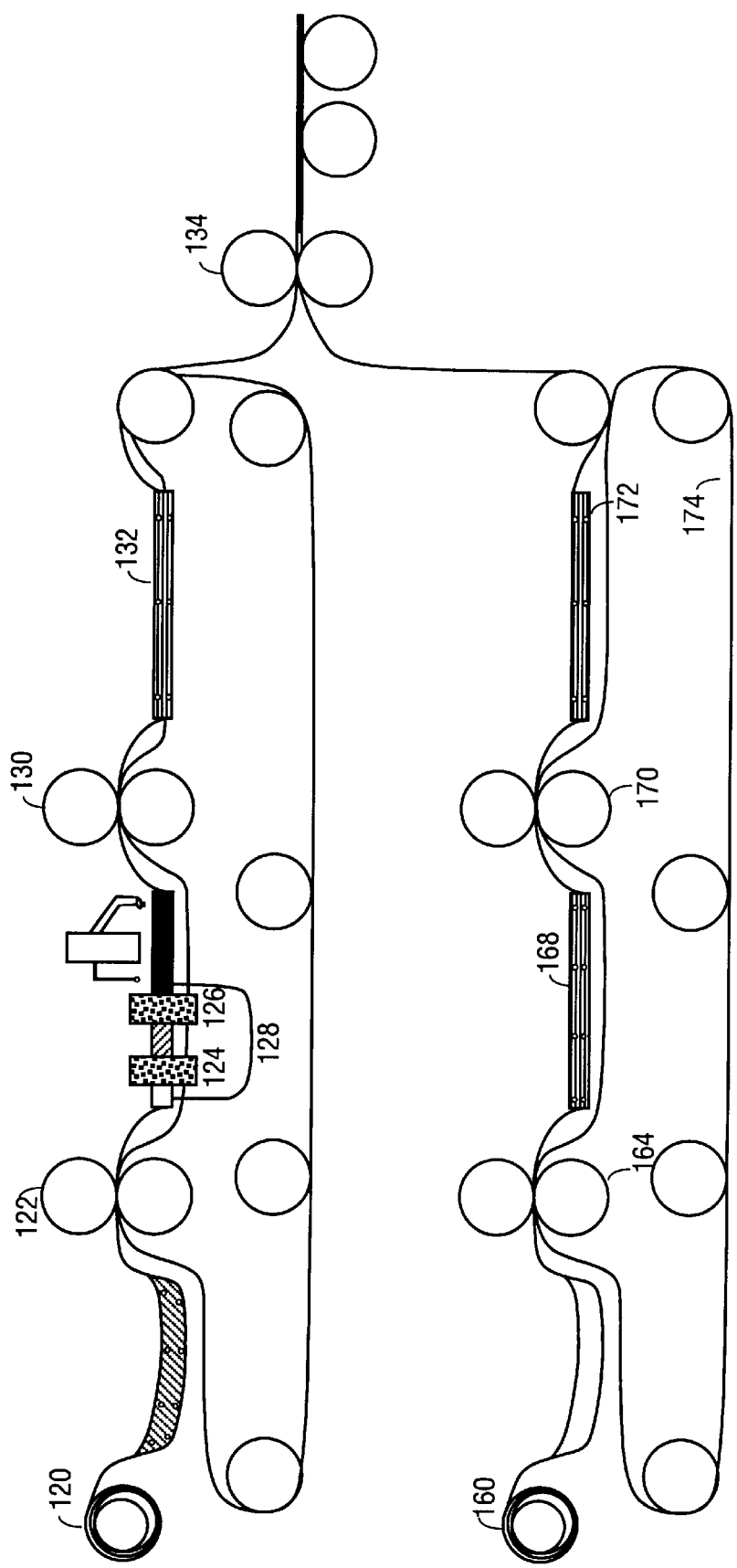
FIG. 13 shows an embodiment of the in-line process of creating receptor regions in a substrate.

FIG. 13 shows an embodiment of in-line process of the invention. A web apparatus machine is used to process the substrate. At operation 120, the web material is unrolled and recessed regions are created in the substrate. These recessed regions can be created by a number of methods. For example, the recessed regions can be punched into the substrate. Another method involves using a template to create the recessed regions. A laser could also be used to create the recessed regions. The substrate advances over a plurality of support members 122. The roller or a template is applied to the substrate to create holes or recessed regions into the substrate. The FSA process is applied to the substrate. FSA comprises a slurry that contains a plurality of functional blocks. These blocks have, in one embodiment, a circuit element (not shown) that drives the picture element (not shown). The FSA process occurs at block 124. It is then applied again at 126. The excess slurry is collected in container 128. Then, the substrate advances through support members 130. The substrate then has an interconnect deposited on the top of the substrate 132. The resulting substrate advances over a guide member and meets at a point 134 wherein it is coupled to a display tape that in one embodiment is a substrate that includes separate regions each having a display material on this substrate. A different portion of the process involves the display tape 160. Before the display tape is coupled with the substrate, the display tape goes through its own separate process that is described below.

The display tape has display material 162 deposited on at least one side of the display tape. There are a variety of ways that display material may be deposited onto the display tape. For example, display material may be sprayed onto the display tape. The display material also may be placed on a screen over the display tape. Another method is to place the display tape into a container that holds the display material. The display tape advances through support members 164. The display tape then has display material layered or patterned on the display tape at 168. This display tape then advances through another plurality of support members 170. A large area metal interconnect is then deposited or etched onto the display tape 172. This may be performed by inkjet, lithography and etch, screen print, laser etch, or deposit 174. In one embodiment of the invention, this large interconnect is a cover glass electrode. At point 134, the display tape is coupled with a substrate.

Figure 14:
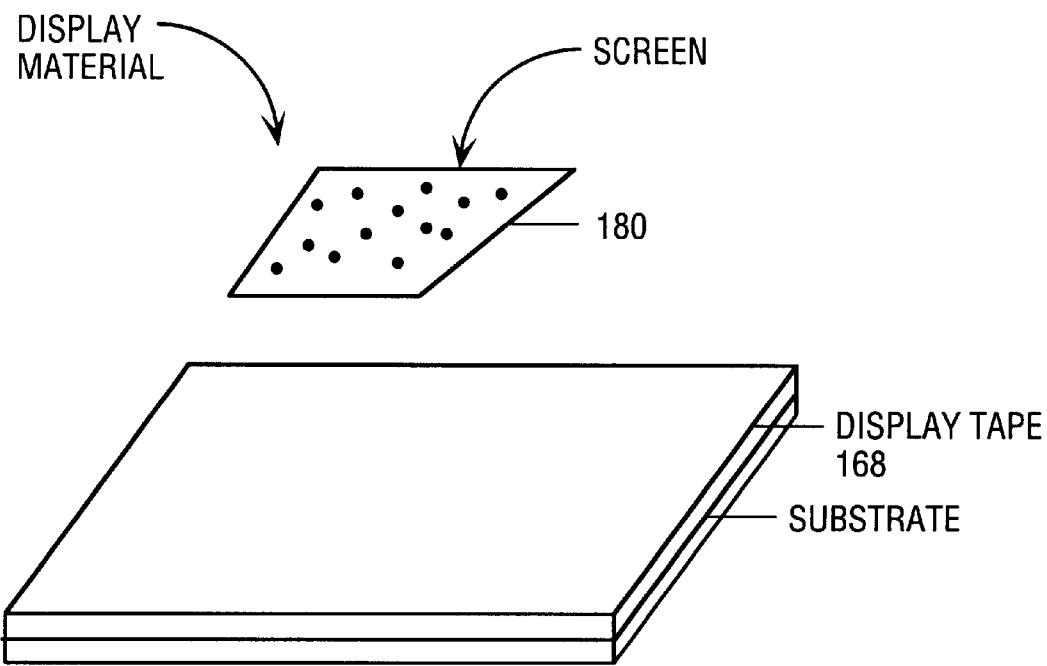
FIG. 14 shows display material being screen printed onto a display tape.

FIG. 14 shows a display material being placed through a screen 180 onto display tape 168. The screen 180 has a desired pattern created by holes that go through the screen 180. This desired pattern may be dictated by a customer or by the manufacturer.

Figure 15:
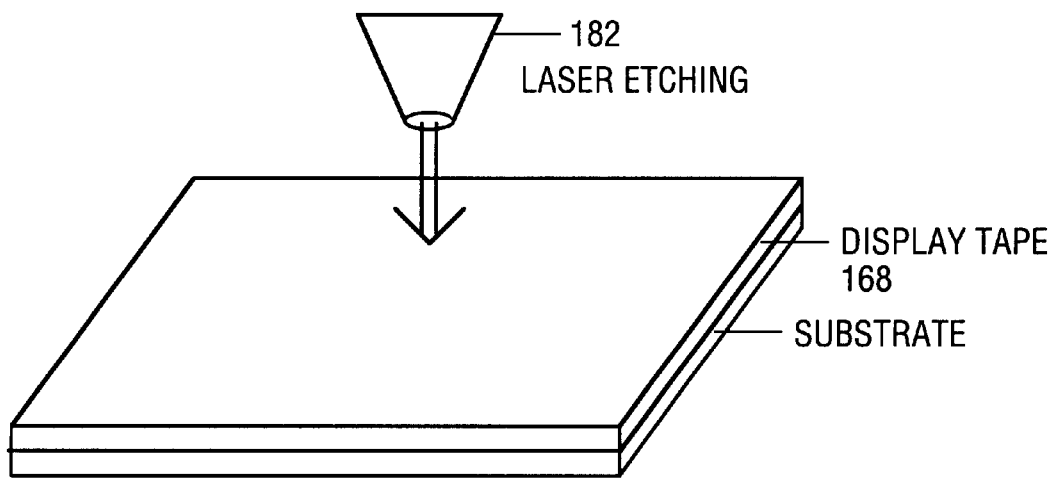
FIG. 15 shows display material being laser printed onto a display tape.

Another method of placing display material onto the display tape is shown in FIG. 15. FIG. 15 shows a top view of display material being laser etched onto display tape 168. The etching occurs when the high intensity light from the laser 182 strikes the display material on top of the display tape 168. A pattern is created in the display material by the laser 182.

Figure 16:
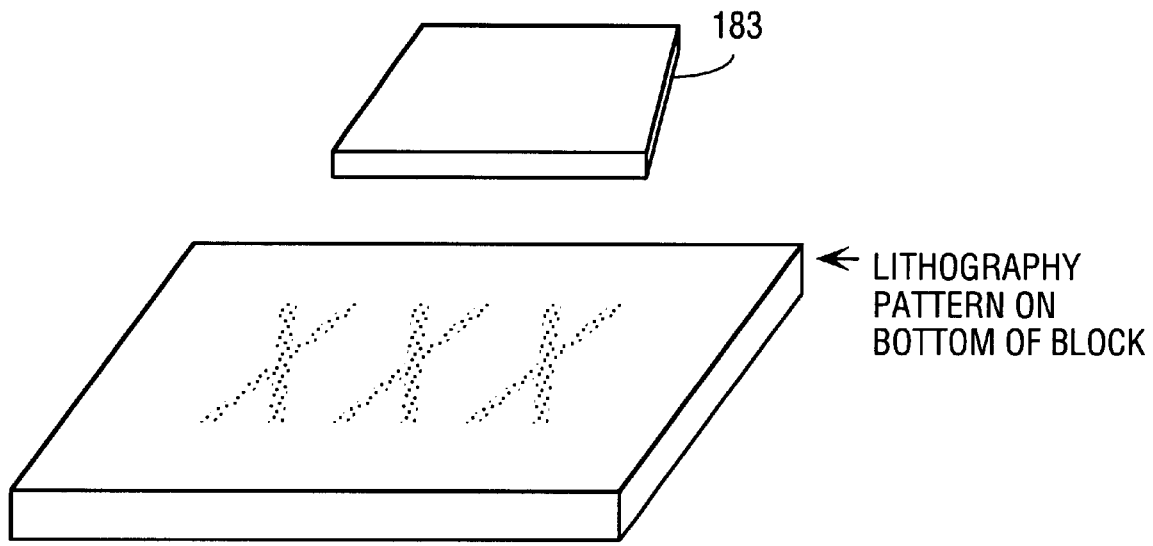
FIG. 16 shows lithography used on display material that is on top of a display tape.

Another method of depositing display material is shown in FIG. 16. FIG. 16 shows lithography being used to pattern the display material. Lithography involves using a block 183 with a pattern engraved in the bottom surface of the block 183. The bottom surface of the block 183 contacts the display material.

Figure 17:
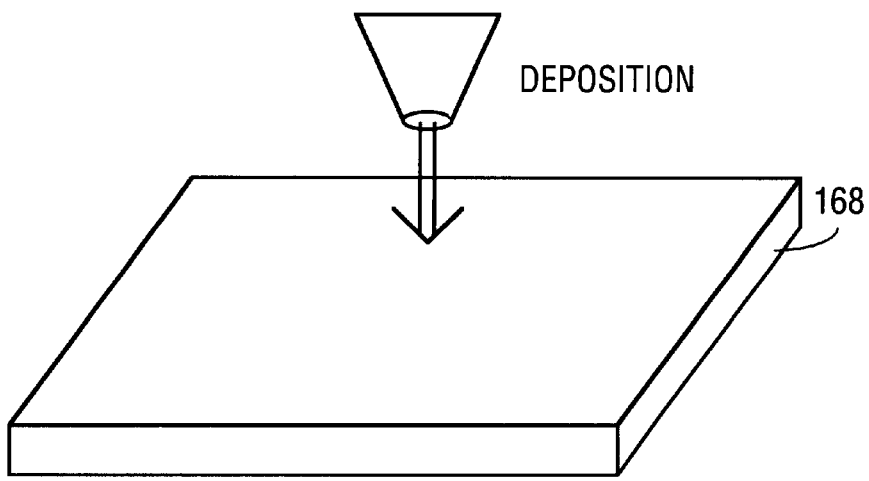
FIG. 17 shows display material being deposited onto display tape by a container.

FIG. 17 shows yet another method of depositing display material onto the display tape. There, display material is deposited in a pattern onto the display tape 168. The display material is deposited by a container 183 that contains the display material. The container 183 is placed over the display tape 168. The display material drops onto the display tape 168 in a pattern.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below are related U.S. Patent Applications that describe various improvements to the methods and devices of the invention described herein. These patent applications and a U.S. Patent are incorporated by reference.

Co-pending U.S. patent application Ser. No. 09/270,146, entitled "Apparatuses and Methods for Forming Assemblies, " filed by Jeffrey J. Jacobsen and assigned to the same Assignee as the present invention, describes a method and apparatus of assembling flexible displays. This co-pending application is hereby incorporated herein by reference.

Co-pending U.S. patent application Ser. No. 09/270,157, entitled "Methods for Transferring Elements From A Template To A Substrate, " filed by Jeffrey J. Jacobsen, Mark A. Hadley, and John Stephen Smith and assigned to the same Assignee of the present invention, describe an FSA on a template with transfer to another substrate. These co-pending applications are hereby incorporated herein by reference.

Co-pending U.S. patent application Ser. No. 09/270,147, entitled "Methods and Apparatuses for Fabricating A Multiple Module Assembly, " filed by Jeffrey J. Jacobsen, Glenn Wilhelm Gengel, and Gordon S. W. Craig and assigned to the same Assignee as the present invention, describes an electronic modular assembly. This co-pending application is hereby incorporated herein by reference.

Co-pending U.S. patent application Ser. No. 09/268,755, entitled "Web Process Interconnect in Electronic Assemblies", filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

Co-pending U.S. patent application Ser. No. 09/270,165, entitled "Apparatuses and Methods for Forming Assemblies", filed by Jeffrey J. Jacobsen and assigned to the same Assignee as the present invention, describes a method of rolling blocks into their recessed regions. This co-pending application is hereby incorporated herein by reference.

U.S. Pat. No. 5,545,291 entitled "Method for Fabricating Self-Assembling Microstructures," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method for fabricating an assembly having a plurality of functional blocks which are deposited on receptor regions of a substrate, said method comprising:

moving a substrate through a web process;

pressing a template against said substrate while in said web process to create receptor regions in the substrate; and depositing a plurality of functional blocks into a plurality of said receptor regions.

2. The method of claim 1, wherein the functional blocks have a shape a portion of which conforms to the shape of the receptor regions.

3. The method of claim 1 wherein the template has a plurality of protruding structures that form the recessed regions in the substrate when the template is pressed against the substrate.

4. The method of claim 3, wherein the protruding structures are spaced on the template such that the recessed regions form an array of columns and rows on a portion of the substrate.

5. The method of claim 2 wherein the template comprises a roller which has a plurality of protruding structures that form the recessed regions in the substrate when the roller is pressed against the substrate.

6. The method of claim 5, wherein the protruding structures are spaced on the template such that the recessed regions form an array of columns and rows on a portion of the substrate.

7. A method comprising:

moving a substrate through a web process;

pressing a template against said substrate while in said web process to create receptor regions in the substrate;

depositing a plurality of functional blocks into a plurality of said receptor regions;

wherein said functional block comprises electrical circuitry for at least one of (a) a liquid crystal display pixel; (b) a light emitting diode display pixel; (c) an organic light emitting diode pixel; (d) a solar cell element; (e) an electromagnetic signal detector, and a (f) plasma display pixel.

8. A method for fabricating an assembly having a plurality of functional blocks which are deposited on receptor regions of a substrate, said method comprising:

moving a substrate through a web process;

pressing a roller against said substrate while in said web process to make a plurality of receptor regions on a surface of said substrate; and depositing a plurality of functional blocks into a plurality of said receptor regions created by said roller on said substrate.

9. The method of claim 8, wherein the functional blocks have a shape a portion of which conforms to the shape of the receptor regions.

* * * * *